United States Patent [19]

Iwasa et al.

[11] Patent Number: 5,070,426
[45] Date of Patent: Dec. 3, 1991

[54] CLIPPER CIRCUIT FOR POWER TRANSISTOR CIRCUIT AND INVERTER CIRCUIT UTILIZING THE SAME

[75] Inventors: Masao Iwasa, Chiba; Yasutami Kito, Aichi, both of Japan

[73] Assignee: Otis Elevator Company, Farmington, Conn.

[21] Appl. No.: 488,526

[22] Filed: Feb. 28, 1990

Related U.S. Application Data

[63] Continuation of Ser. No. 314,359, filed as PCT/JP88/00458 May 13, 1988, published as WO88/09085 Nov. 17, 1988, abandoned.

[30] Foreign Application Priority Data

May 13, 1987 [JP] Japan .................................. 62-71248

[51] Int. Cl.$^5$ ..................................... H02M 7/5387
[52] U.S. Cl. ........................................ 361/91; 363/55; 363/132
[58] Field of Search ............... 361/56, 86, 91; 363/50, 363/55, 56, 57, 58, 127, 132, 133, 134

[56] References Cited

U.S. PATENT DOCUMENTS 4,167,776 9/1979 Nygaard ......................... 363/132 X

FOREIGN PATENT DOCUMENTS 2644715 4/1978 Fed. Rep. of Germany .
2724741 12/1978 Fed. Rep. of Germany .
3527675 2/1987 Fed. Rep. of Germany .
58-133184 8/1983 Japan .
61-180576 8/1986 Japan .

Primary Examiner—A. D. Pellinen
Assistant Examiner—Jeffrey A. Gaffin

[57] ABSTRACT

A clipper circuit includes an auxiliary diode connected between a capacitor and diode, themselves forming a clipper circuit. The auxiliary diode thus forms an auxiliary clipper circuit taking the capacitor as a common capacitor. The clipper circuit diodes shunt current from the capacitor into first and second currents through the diodes. This obviates the necessity for a snubber circuit and power source clipper circuit as employed in the prior art.

16 Claims, 3 Drawing Sheets

CLIPPER CIRCUIT FOR POWER TRANSISTOR CIRCUIT AND INVERTER CIRCUIT UTILIZING THE SAME

This application is a continuation of prior application Ser. No. 07/314,359, filed as PCT/JP88/00458 May 13, 1988, published as WO88/09085 Nov. 17, 1988, now abandoned.

BACKGROUND OF THE INVENTION

1. Field of the Invention

The present invention relates generally to a clipper circuit for a power transistor for absorbing surge voltage. More specifically, the invention relates to a clipper circuit which is suitable for simplification of a power transistor circuit and whereby allowing the power transistor circuit to be made satisfactorily compact.

2. Description of the Background Art

Power transistor circuits have been used in various electric source units as large current control elements. For example, a power transistor may be employed as a switching element in an inverter circuit. In such cases, it is a known technique to provide a clipper circuit in the power transistor circuit for absorbing surge voltages which are generated upon shutting off of the current, thereby protecting the power transistor.

The conventional power transistor circuit, which is employed in a single phase inverter circuit, is associated with a power source clipper circuit interposed between the power transistor circuit and a power source. The power source clipper circuit is designed to absorb surge voltage generated in the power source. The power transistor circuit also incorporates a clipper circuit. The clipper circuit in the power transistor circuit cooperates with the power source clipper circuit at the time of current shut off so that surges having high dv/dt are absorbed by the clipper circuit in the power transistor circuit and large energy surges are absorbed by the power source clipper circuit.

In general, the clipper circuit is incorporated in the power transistor circuit, a series circuit comprised of a capacitor and a diode, and a discharge resistor. The capacitor-diode circuit is connected in parallel to a collector-emitter circuit of a power transistor. When the power transistor is turned OFF, collector current flows through the capacitor-diode series circuit. In the transition, the current is divided by the capacitor and the diode. By dividing the current, voltage surges due to inductance of the wiring and so forth can be absorbed to lower the dv/dt of voltage variations in collector-emitter circuit of the power transistor. However, in the vicinity of the zero-crossing of the divided current, high frequency oscillation tends to be caused. This high frequency oscillation causes turning ON of the power transistor which, in turn causes shorting breakage upon turn-on of the other power transistor circuit. In order to suppress the voltage oscillation, a snubber circuit is provided in the power transistor circuit.

SUMMARY OF THE INVENTION

The present invention is intended to reduce the number of circuit components used in constructing a power transistor circuit and thus allow the power transistor circuit to be made satisfactorily compact.

Therefore, it is an object of the present invention to provide a power transistor circuit including an improved clipper circuit which eliminates the necessity of a snubber circuit.

Another object of the invention is to provide a power transistor circuit which is applicable for an inverter circuit and allows the omission of a power source clipper circuit.

In order to accomplish the aforementioned and other objects, a clipper circuit, according to the present invention, includes an auxiliary diode connected between a capacitor and diode forming a clipper circuit. The auxiliary diode thus forms an auxiliary clipper circuit taking the capacitor as a common capacitor. The auxiliary clipper circuit shunts current through the capacitor into a first and second current flowing through the diodes. This avoids necessity of a snubber circuit and of power source clipper circuit as employed in the power transistor circuit of an inverter circuit.

According to one aspect of the invention, a clipper circuit for a power transistor circuit comprises a first clipper circuit connected in parallel to a collector-emitter circuit of a power transistor and including a capacitor and a first diode, and a second clipper circuit including a second diode connected to the capacitor in parallel to a discharge resistor.

According to another aspect of the invention, a power transistor circuit comprises a power transistor connected to a power source and switching between a first state for establishing a collector-emitter circuit and a second state for blocking the collector emitter circuit for supplying a drive power for a load connected thereto, and a clipper circuit for absorbing surge energy to be generated upon switching of the power transistor from the first state to the second state, the clipper circuit includes a first clipper circuit connected in parallel to a collector-emitter circuit of the power transistor and including a capacitor and a first diode, and a second clipper circuit includes a second diode connected to the capacitor in parallel to a discharge resistor.

According to a further aspect of the invention, an inverter circuit connected to a direct current source via a smoothing circuit including a smoothing capacitor, comprises a plurality of power transistor circuits connected to a load for supplying a driving alternating current to the latter, each of the power transistor circuit includes a power transistor switching between a first state for establishing a collector-emitter circuit and a second state for blocking the collector emitter circuit, and a clipper circuit for absorbing surge energy to be generated upon switching of the power transistor from the first state to the second state, the clipper circuit includes a first clipper circuit connected in parallel to a collector-emitter circuit of the power transistor and including a capacitor and a first diode, and a second clipper circuit including a second diode connected to the capacitor in parallel to a discharge resistor.

In practice, the second diode of the second clipper circuit is connected to a junction between the capacitor and the first capacitor so that current flowing through the capacitor is shunted into a first shunted current flowing through the first diode and a second shunted current flowing through the second diode. Preferably,, the second clipper circuit is provided greater inductance than the first clipper circuit.

With the constructions set forth above, the, first clipper circuit is adapted to absorb high dv/dt surge voltage and second clipper circuit is adapted to absorb surge energy generated by wiring inductance, upon switch of the power transistor from the first state to the second state. The first and second clipper circuits are active for absorbing surge generated upon switching of the power transistor from the first state to the second state and reduces first and second shunted current flowing through the first and second diodes according to rising of charge voltage in the capacitor, and the first and second clipper circuits are so designed as to decrease current levels of the first and second shunted current to zero at mutually different timing.

In order to effectively suppress voltage fluctuation which can be caused by recovery of diodes upon termination of the shunted current, the second clipper circuit preferably maintains the second shunted current after termination of said first shunted current flowing through the first diode.

It is also preferable that the power transistor circuit further comprises an auxiliary capacitor connected in parallel to the first diode. The auxiliary transistor has smaller capacity than the capacitor in the clipper circuits.

In the mechanical construction, the first and second clipper circuits are mounted on a printed circuit board connected to collector and emitter electrode terminal of the power transistor formed on a substrate via connecting screw, the printed circuit board is placed in spaced apart relationship with opposing surface of the substrate. Such construction of circuit assembly effective reduces wiring inductance and provides better surge absorption characteristics.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Figure 1:
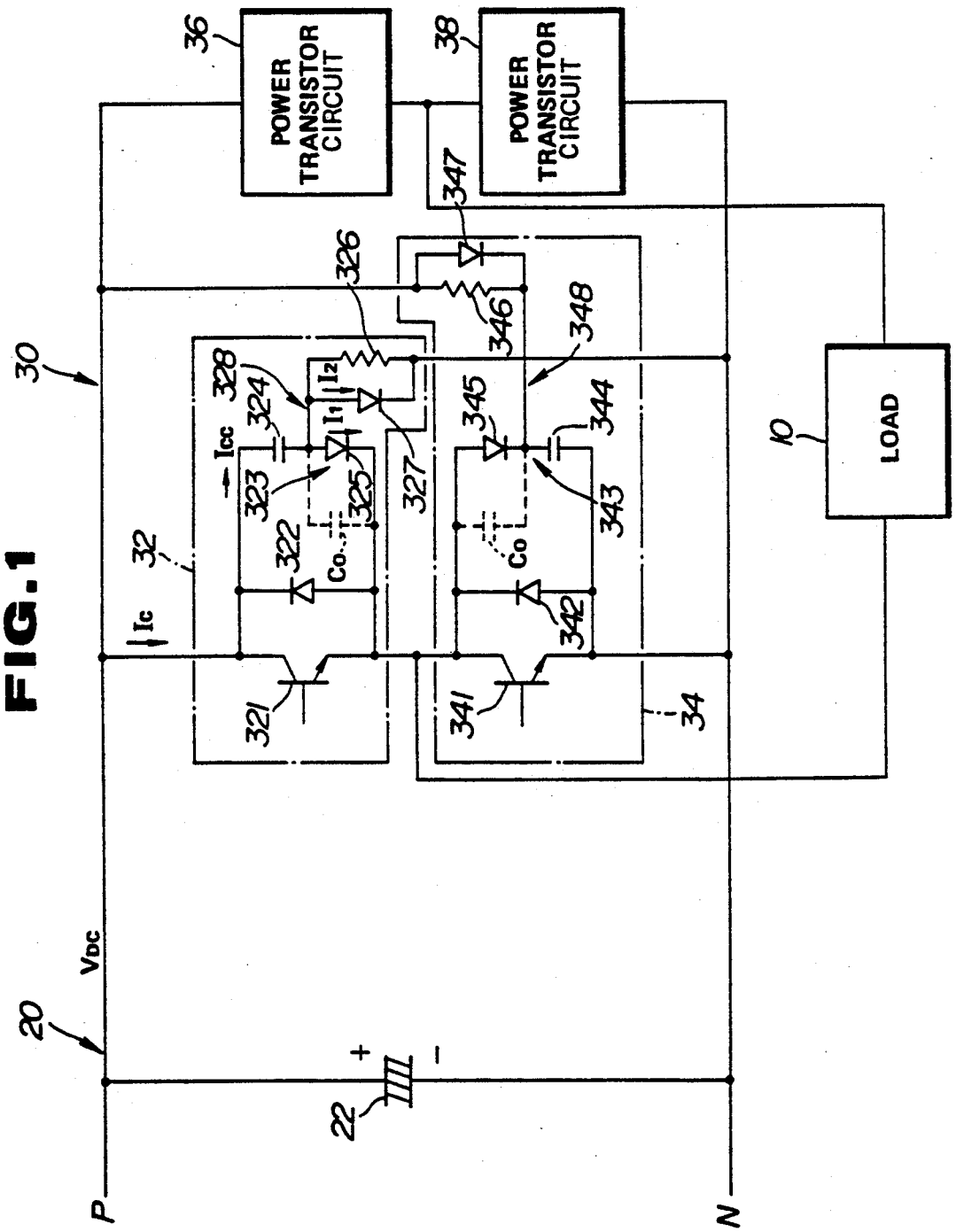
FIG. 1 is a circuit diagram of the a single phase inverter circuit which employs power transistor circuits, each incorporating the preferred embodiment of a clipper circuit according to the present invention.

Referring now to the drawings, particularly to FIG. 1, there is depicted a known main or power circuit of a single phase inverter circuit, which is connected to a load 10, such as an induction motor. The inverter main circuit is connected to a known converter circuit (not shown) to receive direct current power supply therefrom. The inverter main circuit generally comprises a smoothing stage 20 including a smoothing capacitor 22 for smoothing, and an inverter stage which is generally represented by the reference numeral 30. As is well known, the smoothing stage 20 is interposed between the converter and the inverter stage 30 is the inverter main circuit for absorbing ripples in the direct power supplied from the converter.

The inverter stage 30 includes pairs of the power transistor circuits 32, 34 and 36, 38, of the preferred embodiments. These pairs of power transistor circuits 32, 34 and 36, 38 are connected to the load 10 for driving the latter. On the other hand, the power transistor circuits 32, 34 and 36, 38 are connected to a known switching signal generator circuit in an inverter control circuit. Thus, the switching timing is controlled so as to generate a single-phase alternating current to supply to the load 10, in a well known manner.

It should be noted that the power transistor circuits 36 and 38 are identical in construction to the power transistor circuits 32 and 34. Therefore, detailed construction of these power transistor circuits 36 and 38 are not shown in FIG. 1.

The power transistor circuit 32 includes a power transistor 321 connected to the switching signal generator of the control circuit at the base electrode. The collector electrode of the power transistor 321 receives the power source current Ic from the converter. A flywheel diode 322 is connected in parallel to the collector-emitter circuit of the power transistor 321. A first clipper circuit 323 comprising a capacitor 324 and a first diode 325, is also provided in parallel to the collector-emitter circuit of the power transistor 321. A junction between the capacitor 324 and the first diode 325, is connected to the negative terminal of the converter via a discharge resistor 326. A second diode 327 is also connected to the junction between the capacitor 324 a .he first diode 325 in parallel to the discharge resister 326. The second diode 325 thus forms a second clipper circuit 328 with the capacitor 324.

In the preferred construction, the second diode 327 of the second clipper circuit 328 is so designed and arranged as to provide the second clipper circuit 328 a much greater inductance (L) than that of the first clipper circuit 323.

Similarly to the power transistor circuit 32, the power transistor circuit 34 includes a power transistor 341 connected to the switching signal generator of the control circuit at the base electrode. The collector electrode of the power transistor 341 is connected to the emitter electrode of the power transistor 321 to form a series circuit comprised of the power transistors 321 and 341. The emitter electrode of the power transistor 341 is connected to negative terminal of the converter. A junction between the power transistors 321 and 341 is connected to the load 10.

In parallel to the collector-emitter circuit of the power transistor 341, a flywheel diode 342 is connected. A first clipper circuit 343 comprising a capacitor 344 and a first diode 345, is also provided in parallel to the collector-emitter circuit of the power transistor 341. The junction between the capacitor. 344 and the first diode 345, is connected to the positive terminal of the converter via a discharge resistor 346. A second diode 347 is also connected to the junction between the capacitor 344 and the first diode 345 in parallel to the discharge register 346. The second diode 345 thus forms a second clipper circuit 348 with the capacitor 344.

The second diode 347 of the second clipper circuit 348 is so designed and connected as to provide much greater inductance (L) for the second clipper circuit 348 than that of the first clipper circuit 343.

The second clipper circuits 328 and 348 perform an equivalent function to the power source clipper circuit in the conventional inverter main circuit for absorbing surge voltage generated in the converter used as the DC power source, upon shutting OFF of the power supply. These second clipper circuits 328 and 348 are also cooperative with the first clipper circuits 323 and 343 to suppress voltage, fluctuations caused in the off-on transitions of respectively associated power transistors 321 and 341.

Absorption of the voltage fluctuation in the first and second clipper circuits 323 and 328 of the power transistor circuit 32 will be discussed herebelow.

Figure 2:
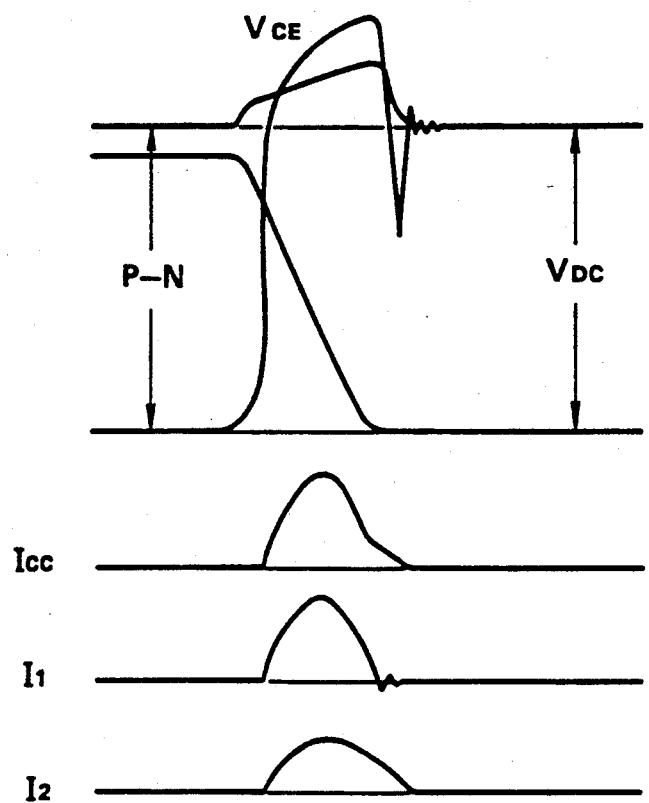
FIG. 2 shows waveforms at various section in the inverter circuit of FIG. 1.

As shown in FIG. 2, when the power transistor 321 is turned OFF, load current Ic at the collector electrode of the power transistor 321 commutates to flow through the capacitor 324 as shunted current Icc. The current through the capacitor 324 is further shunted to flow through the diodes 325 and 327 as shunted currents $I_1$ and $I_2$. In this manner, the capacitor 324 is charged. The collector-emitter voltage $V_{CE}$ of the power transistor 321 is raised according to the increase of the capacitor voltage.

The smoothing capacitor 22 then serves as to absorb surge energy for suppressing fluctuation of the power source voltage $V_{DC}$.

According to the increase of the capacitor voltage by charging the capacitor 324, the shunted currents $I_1$ and $I_2$ flowing through the diodes 325 and 327 drop proportionally to zero. In the embodiment shown, the first and second clipper circuits 323 and 328 are so constructed as to maintain the shunted current $I_2$ flowing through the diode 327 even after the shunted current $I_1$ of the diode 325 becomes zero, as shown in FIG. 2. By this, voltage fluctuation applied to the collector-emitter circuit of the power transistor 321 by reason of the recovery of the diode 325 upon a drop to zero of the shunted current $I_1$ flowing therethrough, can be held to a substantially small magnitude. The magnitude of voltage fluctuation at termination of the shunted current $I_1$ is thereby sufficiently reduced to make a snubber circuit which is required in the conventional circuit, unnecessary.

Upon termination of the shunted current $I_2$, recovery of the diode 327 causes voltage fluctuation due to inductance and capacitance in the whole circuit of the inverter main circuit. However, since the second clipper, circuit 328 is so designed as to have much greater inductance than that of the first clipper circuit, the frequency of the voltage fluctuation can be kept low. Furthermore, backward resistance of the diode 327 aids suppression of the voltage fluctuation. Therefore, even upon recovery of the diode 327, high frequency voltage fluctuation which tends to cause breakdown of the power transistor 321 can be successfully suppressed.

It should be noted that the voltage fluctuation suppressive operation to be performed by the power transistor circuit 34 is substantially the same as that of the power transistor circuit 32 as set forth above. Therefore, detailed discussion about the circuit operation of the power transistor circuit 34 is omitted in order to simplify the disclosure and to avoid unnecessary repetition.

In the circuit construction shown in FIG. 1 and disclosed hereabove, it is further preferable to provide a capacitor $C_0$ which has substantially smaller capacitance that of the capacitors 324 and 344. The capacitance of the capacitor $C_0$ can be one tenth of the capacitance of the capacitor 324, 344, for example. The capacitor $C_0$ may be effective for suppressing large magnitude surge voltages which can be caused upon termination of the shunt current flowing through the diodes 325 and 327.

Figure 3:
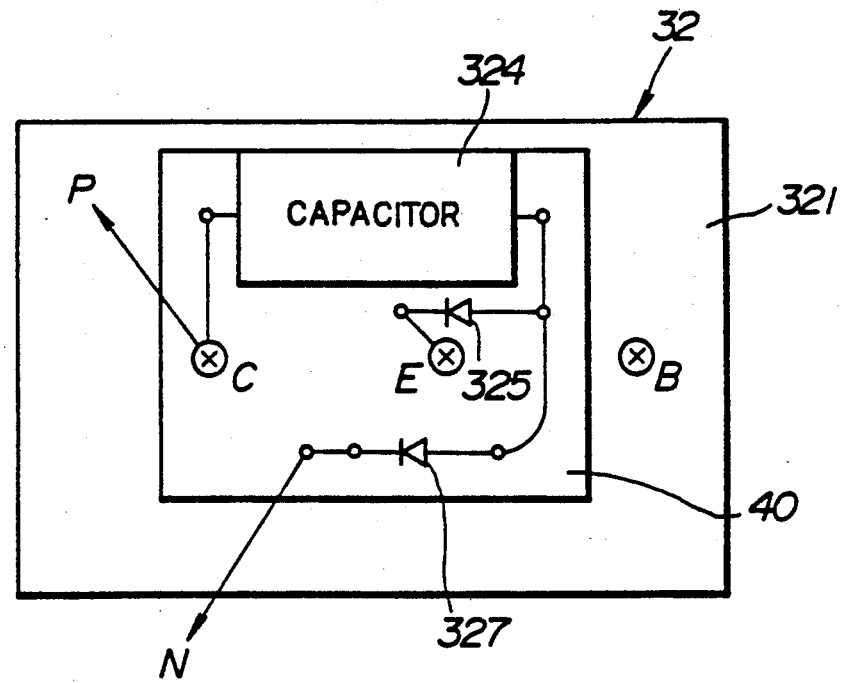
FIG. 3 is a plan view of the preferred construction of an assembly of the power transistor circuit.
Figure 4:
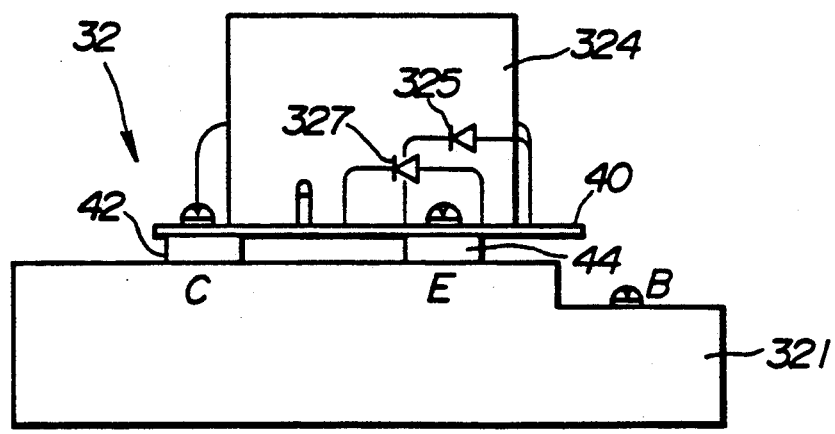
FIG. 4 is a front elevation of the power transistor circuit assembly of FIG. 3.

FIGS. 3 and 4 show the preferred construction of the power transistor circuit 32. The power transistor 321 has a collector electrode terminal C and an emitter electrode terminal E. To these collector electrode terminal C and the emitter electrode terminal E, a printed circuit board 40 is secured by conductive screws. The printed circuit board 40 is oriented in a spaced apart relationship to the opposing surface of the power transistor 321 by means of spacers 42 and 44. The capacitor 324, the diodes 325 and 327, the discharge resistor 326 (not shown) and so forth are rigidly secured on the surface of the printed circuit board 40 with electric connections made by printed wiring on the circuit board.

The construction shown of the power transistor circuit 32 is effective for reducing wiring inductance between the collector and emitter electrode terminals C and E and the clipper circuits 323 and 328 so as to effectively absorb surge voltage.

Figure 5:
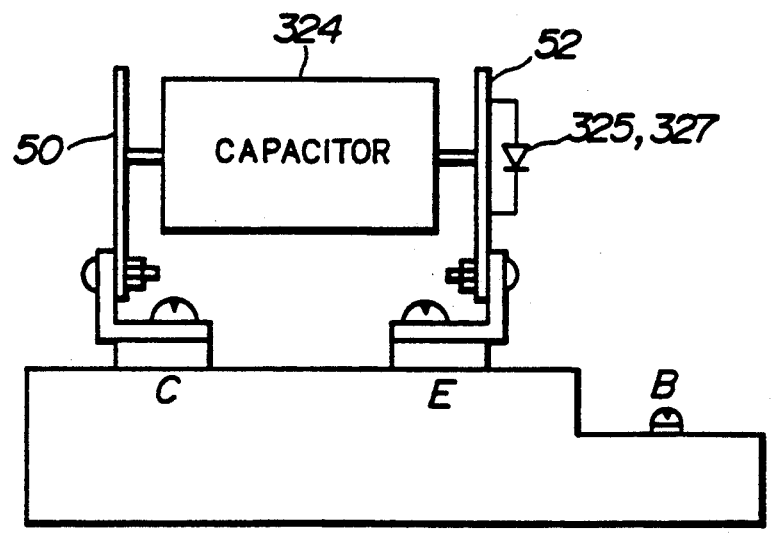
FIG. 5 is a front elevation of another embodiment of the construction of the power transistor circuit assembly according to the invention.

FIG. 5 shows another example of preferred construction of the transistor circuit 32. In this embodiment, pair of printed circuit boards 50 and 52 are secured to the collector and the emitter electrode terminals C and E by means of conductive screws. The printed circuit boards 50 and 52 are arranged essentially perpendicular to the upper surface of the power transistor 321 and in parallel to each other. The pair of printed circuit boards 50 and 52 support therebetween the capacitor 324. Other circuit elements, such as the diodes 325 and 327, the discharge resistor 326 (not shown) and so forth are mounted on one of the printed circuit boards 50 and 52.

The circuit construction illustrated in FIG. 5 is also effective for reducing the amount of wiring inductance and effectively absorbing the surge voltage.

Therefore, the invention fulfills all of the objects and advantages sought therefore.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A clipper circuit for a power transistor circuit including a power transistor comprising:
    a first clipper circuit, adapted to absorb high dv/dt surge voltage, connected in parallel to a collector-emitter circuit of said power transistor and including a capacitor and a first diode; and
    a second clipper circuit, adapted to absorb surge energy generated by wiring inductance upon turning OFF of said power transistor, including a second diode connected to said capacitor in parallel to a discharge resistor wherein said second diode is connected to a junction between said capacitor and said first diode so that current flowing through said capacitor is shunted into a first shunted current flowing through said first diode and a second shunted current flowing through said second diode.

2. A clipper circuit as set forth in claim 1, wherein said second clipper circuit has greater inductance than said first clipper circuit.

3. A clipper circuit as set forth in claim 1, wherein said first and second clipper circuits are active for absorbing surges generated upon turning OFF of said power transistor and for reducing said first and second shunted currents flowing through said first and second diodes according to increasing voltage in said capacitor, and said first and second clipper circuits cause said first and second shunted currents to be decreased to zero at mutually different timings.

4. A clipper circuit as set forth in claim 3, wherein said second clipper circuit maintains said second shunted current after termination of said first shunted current flowing through said first diode.

5. A power transistor circuit comprising:
a power transistor connected to a power source and switching between a first state for establishing a collector-emitter circuit and a second state for blocking said collector-emitter circuit for supplying drive power to a load connected thereto; and
a clipper circuit for absorbing surge energy to be generated upon switching of said power transistor from said first state to said second state, said clipper circuit including
a first clipper circuit connected in parallel to said collector-emitter circuit of said power transistor and including a capacitor and a first diode; and
a second clipper circuit including a second diode connected to said capacitor in parallel to a discharge resistor;
wherein said first clipper circuit is adapted to absorb high dv/dt surge voltage and said second clipper circuit is adapted to absorb surge energy generated by wiring inductance, upon switching of said power transistor from said first state to said second state and wherein said second diode of said second clipper circuit is connected to a junction between said capacitor and said first diode so that current flowing through said capacitor is shunted into a first shunted current flowing through said first diode and a second shunted current flowing through said second diode.

6. A power transistor circuit as set forth in claim 5, wherein said second clipper circuit is provided greater inductance than said first clipper circuit.

7. A power transistor circuit as set forth in claim 5, wherein said first and second clipper circuits are active for absorbing surges generated upon switching of said power transistor from said first state to said second state and for reducing said first and second shunted currents through said first and second diodes according to the increase of charge voltage in said capacitor, and said first and second clipper circuits cause said first and second shunted currents to be decreased to zero at different times.

8. A power transistor circuit as set forth in claim 7, wherein said second clipper circuit maintains said second shunted current after termination of said first shunted current flowing through said first diode.

9. A power transistor circuit as set forth in claim 5, which further comprises an auxiliary capacitor connected in parallel to said first diode.

10. A power transistor circuit as set forth in claim 9, wherein said auxiliary capacitor has smaller capacity than said capacitor in said first clipper circuit.

11. An inverter circuit connected to a direct current source via a smoothing circuit including a smoothing capacitor; comprising:
a plurality of power transistor circuits connected to a load for supplying an alternating current to the latter, each of said power transistor circuits including a power transistor switching between a first state for establishing a collector-emitter circuit and a second state for blocking said collector-emitter circuit; and
a clipper circuit for absorbing surge energy generated upon switching of said power transistor from said first state to said second state, said clipper circuit including a first clipper circuit, adapted to absorb high dv/dt surge voltage, connected in parallel to said collector-emitter circuit of said power transistor and comprising a capacitor and a first diode, and a second clipper circuit adapted to absorb surge energy generated by wiring inductance, upon switching of said power transistor from said first state to said second state including a second diode connected to said capacitor in parallel to a discharge resistor wherein said second diode of said second clipper circuit is connected to a junction between said capacitor and said first diode so that current flowing through said capacitor is shunted into a first shunted current flowing through said first diode and a second shunted current flowing through said second diode.

12. An inverter circuit as set forth in claim 11, wherein said second clipper circuit is provided greater inductance than said first clipper circuit.

13. An inverter circuit as set forth in claim 11, wherein said first and second clipper circuits are active for absorbing surges generated upon switching of said power transistor from said first state to said second state and for reducing said first and second shunted currents flowing through said first and second diodes according to increasing voltage in said capacitor, and said first and second clipper circuits said first and second shunted currents to be decreased to zero at mutually different timings.

14. An inverter circuit as set forth in claim 13, wherein second clipper circuit maintains said second shunted current after termination of said first shunted current flowing through said first diode.

15. A power transistor circuit comprising:
a power transistor connected to a power source and switching between a first state for establishing a collector-emitter circuit and second state for blocking said collector-emitter circuit for supplying drive power to a load connected thereto; and
a clipper circuit for absorbing surge energy to be generated upon switching of said power transistor from said first state to said second state, said clipper circuit including
a first clipper circuit connected in parallel to said collector-emitter circuit of said power transistor and including a capacitor, and a first diode and an auxiliary capacitor connected in parallel to said first diode; and
a second clipper circuit including a second diode connected to said capacitor in parallel to a discharge resistor and wherein said second diode of said second clipper circuit is connected to a junction between said capacitor and said first diode so that current flowing through said capacitor is shunted into a first shunted current flowing through said first diode and a second shunted current flowing through said second diode.

16. A power transistor circuit comprising:
a power transistor connected to a power source and switching between a first state for establishing a collector-emitter circuit and second state for blocking said collector-emitter circuit for supplying drive power to a load connected thereto; and a clipper circuit for absorbing surge energy to be generated upon switching of said power transistor from said first state to said second state, said clipper circuit including a first clipper circuit connected in parallel to said collector-emitter circuit of said power transistor and including a capacitor and a first diode; and a second clipper circuit including a second diode connected to said capacitor in parallel to a discharge resistor;

wherein said first and second clipper circuits are mounted on a printed circuit board connected to collector and emitter electrode terminals of said power transistor formed on a substrate via connecting screws, and wherein said printed circuit board is placed in spaced apart relationship from said substrate.

* * * * *